United States Patent
Ichikawa

(10) Patent No.: US 6,593,968 B1
(45) Date of Patent: Jul. 15, 2003

(54) LINEAR IMAGE SENSOR, IMAGE READING DEVICE, AND CHARGE TRANSFER METHOD

(75) Inventor: Hirokazu Ichikawa, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/207,582

(22) Filed: Dec. 8, 1998

(30) Foreign Application Priority Data

Jan. 6, 1998 (JP) ............................................ 10-000601

(51) Int. Cl.[7] .......................... H04N 5/335; H04N 1/46; H01L 29/768; H01L 27/148
(52) U.S. Cl. ...................... 348/324; 348/316; 348/323; 358/514; 358/483; 257/234
(58) Field of Search ................................ 348/324, 323, 348/316, 201, 303, 294, 195, 196, 166, 167; 358/514, 513, 482, 483; 250/208.1; 257/234, 238

(56) References Cited

U.S. PATENT DOCUMENTS

| | | | | |
|---|---|---|---|---|
| 4,281,254 A | * | 7/1981 | Seachman | 348/316 |
| 4,472,744 A | * | 9/1984 | Inoue et al. | 358/483 |
| 4,540,901 A | * | 9/1985 | Suzuki | 358/483 |
| 4,641,185 A | * | 2/1987 | Alston et al. | 358/513 |
| 4,647,977 A | * | 3/1987 | Tower | 348/321 |
| 4,819,072 A | * | 4/1989 | Boucharlat et al. | 348/316 |
| 5,025,318 A | * | 6/1991 | Nagura | 348/316 |
| 5,285,295 A | * | 2/1994 | Kai et al. | 358/483 |
| 5,317,423 A | * | 5/1994 | Harada | 358/482 |
| 5,345,319 A | * | 9/1994 | Yu | 358/483 |
| 5,379,067 A | * | 1/1995 | Miura | 348/294 |
| 5,539,536 A | * | 7/1996 | Maki et al. | 358/483 |
| 6,153,874 A | * | 11/2000 | Monoi | 348/316 |

FOREIGN PATENT DOCUMENTS

| | | | | |
|---|---|---|---|---|
| JP | 59099764 A | * | 6/1984 | .......... H01L/27/14 |
| JP | 60132363 A | * | 7/1985 | .......... H01L/27/14 |
| JP | A-4-243138 | | 8/1992 | |
| JP | 05048841 A | * | 2/1993 | ............ H04N/1/04 |
| JP | 10229476 A | * | 8/1998 | ............ H04N/1/19 |
| JP | 11196334 A | * | 7/1999 | .......... H04N/5/335 |

OTHER PUBLICATIONS

Monoi et al.; "A 5V CCD Linear Image Sensor"; 1992 Custom Integrated Circuits Conference, IEEE.*
Hirama et al.; A 5000–pixel Linear Image Sensor with On–Chip Clock Drivers; 1990, IEEE.*
Hsieh et al.; "Linear Image Sensor Optimized for Fast Color Scanning"; Aug. 1992, IEEE Transactions on Consumer Electronics; vol. 38, No. 3; pp. 576–582.*
Kawamoto et al.; "A CCD Color Linear Image Sensor Employing New Transfer Method"; 1991; IEEE.*

* cited by examiner

Primary Examiner—Wendy R. Garber
Assistant Examiner—John M Villecco
(74) Attorney, Agent, or Firm—Oliff & Berridge PLC

(57) ABSTRACT

The linear image sensor according to the present invention includes a light receiving a member consisting of at least three light receiving pixel lines 11, 12 and 13; signal charge transfer sections 31, 32, 33, 34, 35 and 36 located on both sides of each of the light receiving pixel lines 11, 12 and 13 of the light receiving a member; and branch transfer sections 33c and 34c which branch from the signal charge transfer sections 33 and 34, which are located on both sides of at least one of the at least three light receiving pixel lines 11, 12 and 13, to extend to reach the signal charge transfer sections 32 and 35 of the adjacent light receiving pixel lines 11 and 13.

15 Claims, 8 Drawing Sheets

1

LINEAR IMAGE SENSOR, IMAGE READING DEVICE, AND CHARGE TRANSFER METHOD

BACKGROUND OF THE INVENTION

The present invention relates to a linear image sensor for capturing charges by lines of light receiving pixels and transferring them to acquire an output signal, an image reading device and a charge transfer method.

In a color document reading device such as a color copier and color scanner, three-line color linear sensor provided with three lines of light receiving pixels for reading Red light, Green light and Blue light.

Generally, a three-line color linear sensor for the purpose of high speed reading is provided with signal charge transfer sections on both sides of each of the Red light receiving pixel line, Green light receiving pixel line and Blue light receiving pixel line so that the signal charges at even number pixels and odd number pixels are separated to provide parallel outputs corresponding to two channels for each color and hence a total of six channels, thereby realizing high speed read in some degree.

In recent years, the need for the high quality of read image has increased the density of a required pixel from 400 dpi (dot per inch) to 600 dpi or more. Correspondingly, the unit pixel area at the light receiving section of the image sensor has been reduced.

Thus, the signal charge generated in a photo-diode section at the same light intensity is reduced and hence the substantial sensitivity is also reduced. In order to compensate for such a reduction, an efficiency of converting the signal charge into a voltage at an output section must be improved. However, an increased gain principally has an adverse effect on the frequency characteristic of the output section. This makes it very difficult to realize both high speed and high sensitivity of signal reading.

At present, the scanning speed in a sub-scanning direction which permits high quality color reading at a read pixel density of 600 dpi has an upper limit of 210 mm/sec. The speed of the sub-scanning direction is attributable to the limit of the frequency characteristic of the output amplifier section which reads out the signal of each pixel of the sensor.

Generally, where the outputs from the light receiving pixel lines are transferred by the signal charge transfer sections corresponding to two flows consisting of odd number pixels and even number pixels, the transfer speed at a transfer electrode has a margin, but is limited by the upper limit of about 20 MHz of the frequency characteristic of the output amplifier section. This results in the transfer speed of about 40 MHz at a totaled video rate in the two flows.

Thus, 7500 pixels, which are required to read a document having a A3 size (JIS standard) at a read pixel density of 600 dpi, can be read at the reading speed:

40 MHz÷7500 (pixels)÷23.6 (pixels/mm)=226 (mm/s).

However, in view of the shifting period of the signal charge and transfer period of the ineffective pixels, the reading speed is limited to 210 mm/sec described above.

A digital full color copier which is generally used in an office is provided with a three-line color image sensor capable of making high speed reading described above at the document reading section. In order to copy a good full color image in the digital full copier, the tone of each color signal in the document to be read is important. For example, the reproductivity of 256 tones for each color signal is required.

Therefore, when the document is read, in order to assure a sufficient quantity of exposure light incident on the three-line color image sensor, an illumination optical system or a read scanning speed must be set.

On the other hand, in the digital full color copier having such a setting, where a monochromatic image which has a text document or linear image to be mainly copied is copied, unlike copying of the full color image, the improved tone reproductivity is not valued, but the high speed permitting a large number of sheets to be taken per a unit time is required.

In order to realize compatibility between the high quality full color copying function, which utilizes the function of digital reading by a single copier, and the high speed monochromatic copying function of an analog copier, the constraint for the high quality full color reading becomes a burden on the high speed monochromatic image reading.

Specifically, when the monochromatic image is read using the same image sensor as when the full color image is read, it can be read only at the speed equal to that in reading the color image. Therefore, the monochromatic image cannot be read at the high speed equal to that in an analog copier dedicated to the monochromatic image.

Meanwhile, when plural sheets are copied for a sheet of document, the information for a sheet of document stored in a memory may be continuously transferred to a printer section. This eliminates the burden of the high speed on the reading section.

However, when different documents are continuously copied one by one by an attached document automatic feeder, the same information cannot be produced from the memory. This requires the documents to be read at a high speed.

As a "monochromatic sensor", a CCD linear image sensor capable of reading the document at a high speed as shown in FIG. 8 has been proposed (JP-A-4-243138). In the CCD linear image sensor, the charges captured by a single line 100 of photosensitive pixels are transferred in a manner divided into two flows of CCD shift registers 101 and 102 for odd and even number pixels. On the way, the charges are transferred in a manner distributed into four flows consisting of two CCD shift registers 101a and 101b distributed from the CCD shift register 101 and two CCD shift registers 102a and 102b divided from the CCD shift register 102. Such a transferring manner permits the high speed of the charge transfer.

Assuming that the upper limit of the frequency characteristic in each output section is e.g. 20 MHz, the above configuration for parallel outputting of the four flows permits the signal charges to be output at the maximum data rate of 80 MHz.

However, if the above configuration is applied to a three-line color image sensor as it is, a total of 12 flows are required to capture the signals for three colors. This leads to an increase in the width of a sensor chip and large-scaling of an output processing circuit such as an analog circuit and an A/D converter.

Also, in the case where only the output section for capturing only the one color in the three-line sensor is designed in four flows, the output sections corresponding to a total of eight flows are required. This gives rise to the same problems as described above.

SUMMARY OF THE INVENTION

The linear image sensor according to the present invention comprises: a first and a second light receiving pixel lines for making photo-electric conversion; a first charge transfer means for transferring charges acquired from the first light receiving pixel line through the photo-electric conversion; a second charge transfer means for transferring charges acquired from the second light receiving pixel line through the photo-electric conversion; and a first branch transfer means for branching the charges from the first charge transfer means and transferring them to the second charge transfer means.

The image reading device using a linear image sensor according to the present invention comprises a first and a second light receiving pixel line for making photo-electric conversion; a first charge transfer means for transferring charges acquired from the first light receiving pixel line through the photoelectric conversion; a second charge transfer means for transferring charges acquired from the second light receiving pixel line through the photo-electric conversion; and a first branch transfer means for transferring the charges branched from the first charge transfer means to the second charge transfer means.

In the above linear image sensor and image reading device using it, the first branch transfer means permits a part of the transferred charges to be further transferred using the charge transfer means for the adjacent light receiving pixel line.

The charge transfer method according to the present invention for a linear image sensor including a first and a second light receiving pixel line for making photo-electric conversion comprises the steps of: transferring charges acquired from the first light receiving pixel line through the photo-electric conversion by a first charge transfer means; transferring charges acquired from the second light receiving pixel line through the photo-electric conversion by a second charge transfer means; and branching the charges from the first charge transfer means at a branching point and transferring them to the second charge transfer means.

In the charge transfer method according to the present invention, the charges can be transferred at a high speed before the branching point and they can be transferred after the branching point.

DETAILED DESCRIPTION OF THE PREFERRED EMBODIMENTS

Figure 1:
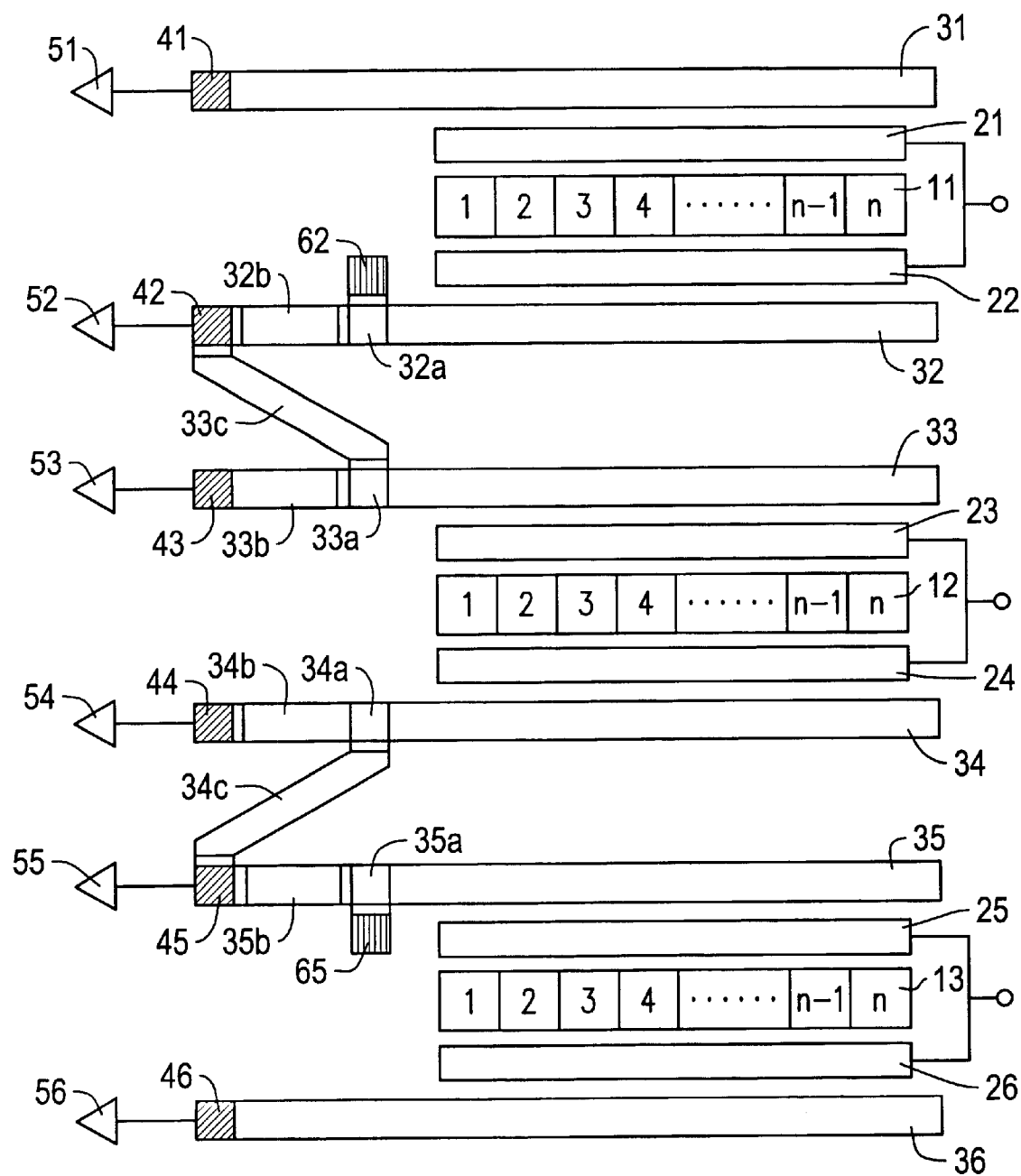
FIG. 1 is a schematic plan view illustrating an embodiment of the present invention.

Now, referring to the drawings, an explanation will be given of embodiments of the invention. FIG. 1 is a schematic plan view illustrating the structure of a color image sensor according to an embodiment of the present invention. The color image sensor is a three-line color image sensor consisting of three lines arranged substantially in parallel of a Red light receiving pixel line 11, a Green light receiving pixel line 12 and a Blue light receiving pixel line 13.

On both sides of each of the light receiving pixel lines 11, 12 and 13, signal charge shift gates 21, 22; 23, 24; and 25, 26 are arranged for transferring the charges captured by the corresponding light receiving pixel lines in a vertical direction on the drawing.

Further, on both sides of each of the light receiving pixel lines 11, 12 and 13, between which the signal charge shift gates 21, 22; 23, 24; and 25, 26 intervene, respectively, signal charge transfer sections 31, 32; 33, 34; 35, 36 are arranged for transferring the transferred charges in a horizontal direction on the drawing.

To the final stages in the charge transfer directions of the respective signal charge transfer sections 31, 32, 33, 34, 35 and 36, final stage electrodes 41, 42, 43, 44, 45 and 46 are connected. To these electrodes, output circuits 51, 52, 53, 54, 55 and 56 are connected each of which consists of a signal charge detection section and an analog circuit such as a source follower, inverter, etc.

The feature of this embodiment resides in that the signal charge transfer sections 32, 33, 34 and 35 include branch electrodes 32a, 33a, 34a and 35a, respectively, each of which serves to branch the charge transfer direction into two directions of charge transfer section 32b and charge drain 62, charge transfer section 33b and branch transfer section 33c, charge transfer section 34b and branch transfer section 34c, and charge transfer section 35b and charge drain 65.

The charge drains 62 and 65 serve to exhaust unnecessary charges (unnecessary charges according to a read mode) transferred by the signal charge transfer sections 32 and 35, respectively.

An explanation will be given of a charge transfer method in the color image sensor configured as described above. First, an explanation will be given of reading of a color image (color mode).

The signal charges generated and stored in the light receiving pixel lines 11, 12 and 13 are distributed into odd-number-pixel charges and even-number-pixel charges which are in turn transferred to the signal charge transfer sections 31, 32; 33, 34; and 35, 36 through the signal charge shift gates 21, 22; 23, 24; and 25, 26, respectively.

In the signal transfer sections 31, 32, 33, 34, 35 and 36, each of which may be constructed by e.g. a two-phase drive CCD, the signal charges are transferred at two-phase clocks of 20 MHz. It should be noted that the charges transferred by the signal charge transfer sections 31 and 36, as they are, are sent to the output circuits 51 and 56 through the final stage electrodes 41 and 46, respectively.

The charges transferred by the signal charge transfer sections 32, 33, 34 and 35 are transferred through the branch electrodes 32a, 33a, 34a and 35a, respectively.

Figure 2:
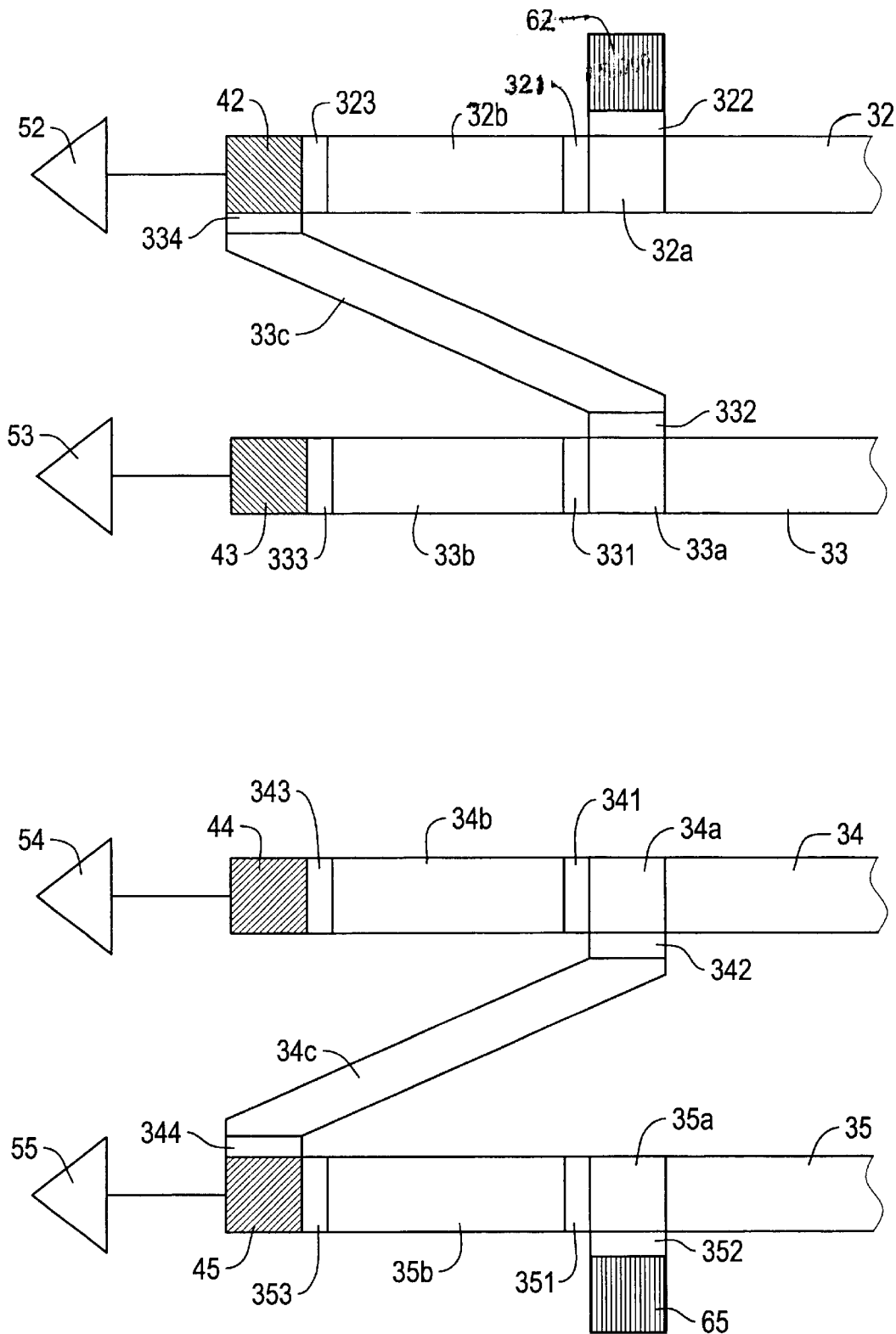
FIG. 2 is a partial enlarged view of branch electrodes.

FIG. 2 is a partially enlarged view of the branch electrodes. As seen from FIG. 2, the respective branch electrode 32a, 33a, 34a and 35a of the signal charge transfer sections 32, 33, 34 and 35 include gate electrodes for controlling the charge transfer to the subsequent stage in a branch direction.

Specifically, the branch electrode 32a is equipped with gate electrodes 321 and 322; the branch electrode 33a is equipped with gate electrodes 331 and 332; the branch electrode 34a is equipped with gate electrodes 341 and 342; and the branch electrode 35a is equipped with gate electrodes 351 and 352.

Further, a gate electrode 323 is arranged between the electrode transfer section 32b and the final stage electrode 42; a gate electrode 334 is arranged between the branch transfer section 33c and the final stage electrode 42; and a gate electrode 333 is arranged between the charge transfer section 33b and final stage electrode 43.

Moreover, a gate electrode 343 is arranged between the charge transfer section 34b and final stage electrode 44; a gate electrode 344 is arranged between the branch transfer section 34c and the final stage electrode 45; and a gate electrode 353 is arranged between the charge transfer section 35b and final stage electrode 45.

Figure 3:
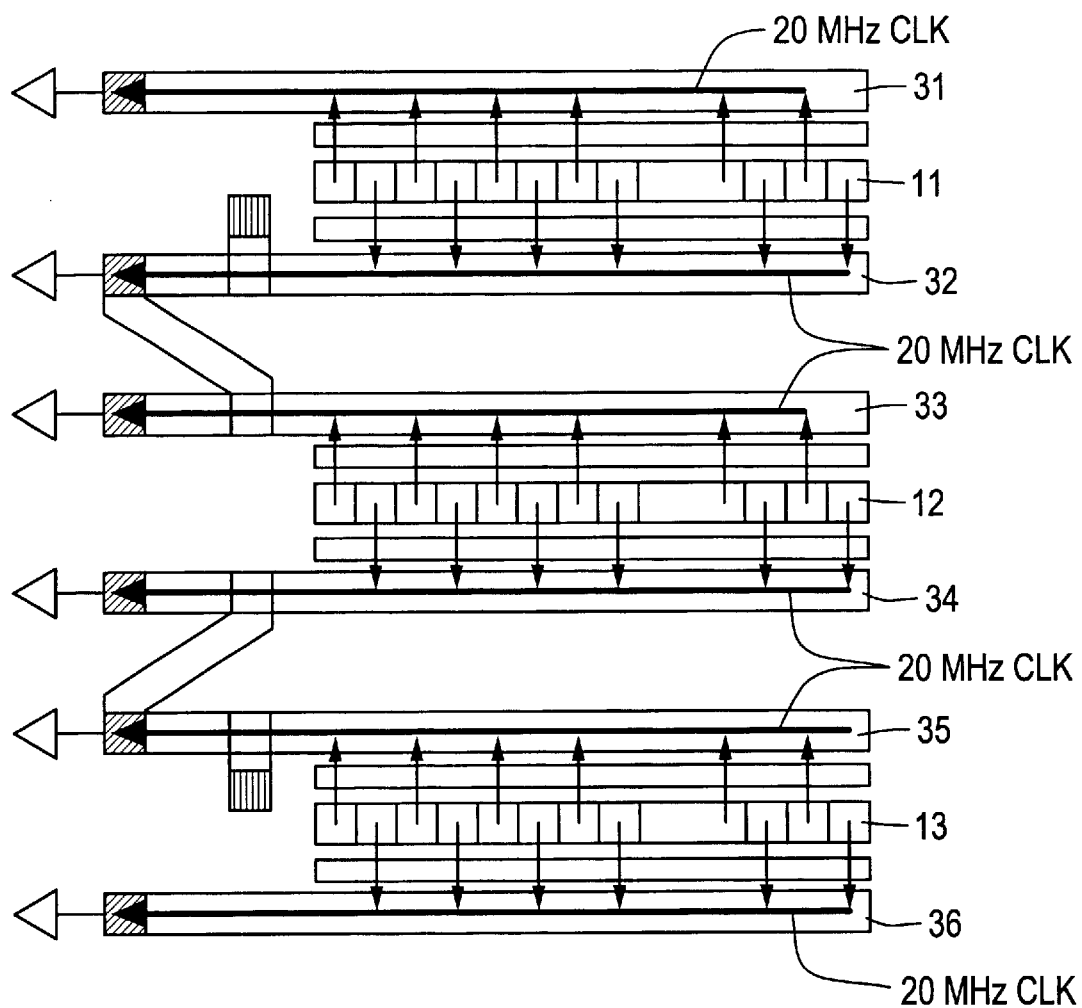
FIG. 3 is a view illustrating transfer directions of signal charges in a color mode.

By placing the gate electrodes 321, 323; 331, 333; 341, 343; and 351, 353 in an opened state, and by placing the gate electrodes 322; 332, 334; 342, 344; and 352 in a closed state, the charges transferred along the signal charge transfer sections 32, 33, 34 and 35 can be sent, as they are, as shown in FIG. 3 (leftward in the drawing).

In this case, by supplying two-phase clocks at 20 MHz to each of the charge transfer sections 32b, 33b, 34b and 35b, which is also used for the signal charge transfer sections 31, 32, 33, 34, 35 and 36, the signal charges by the signal charge transfer sections 32, 33, 34 and 35, as they are, can be guided to the final stage electrodes 42, 43, 44 and 45 through the charge transfer sections 32b, 33b, 34b and 35b, respectively.

Thus, the signal charges corresponding to the respective colors of Red, Green and Blue are guided to the output circuits 51, 52; 53, 54; and 55, 56, each consisting of a signal charge detecting section and an analog circuit such as a source follower, inverter, etc, through the final stage electrodes 41, 42; 43, 44; and 45, 46, respectively. Accordingly, they are externally produced as voltage signals for a total of six channels of Red-Odd, Red-Even, Green-Odd, Greed-Even, Blue-Odd and Blue-Even.

Incidentally, since the data rate at each of the output sections is 20 MHz, that of each color signal for Red, Green and Blue is equal to 20 MHz×2=40 MHz.

Now, an explanation will-be given of the charge transfer method for performing the high speed monochromatic image reading (monochromatic mode) using the color linear sensor according to this embodiment.

The signal charges generated and stored in the light receiving pixel lines 11, 12 and 13 are distributed into odd-number-pixel charges and even-number-pixel charges which are in turn transferred to the signal charge transfer sections 31, 32; 33, 34; and 35, 36 through the signal charge shift gates 21, 22; 23, 24; and 25, 26, respectively.

Figure 4:
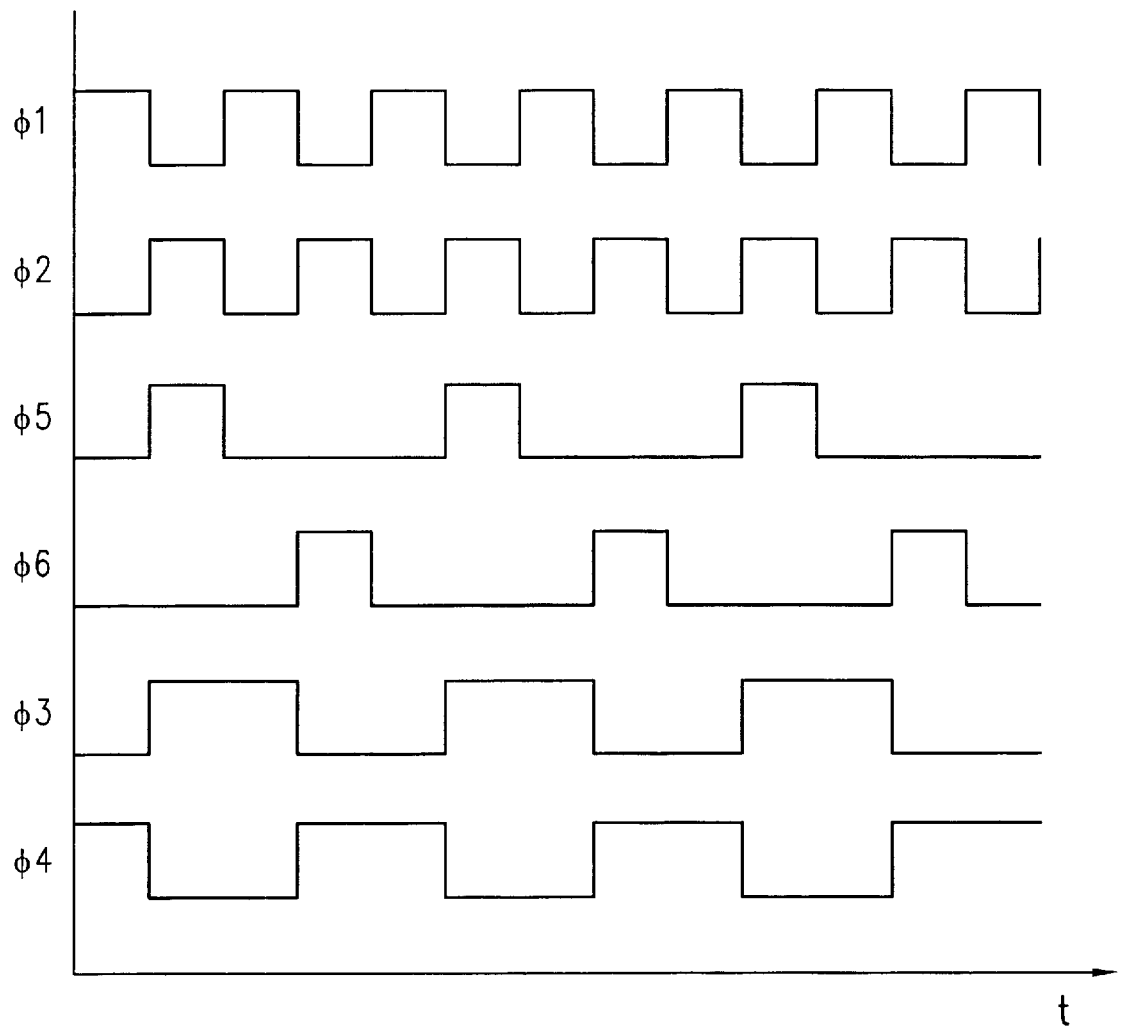
FIG. 4 is a timing chart of transfer clocks.

In the signal transfer sections 31, 32, 33, 34, 35 and 36, each of which may be constructed by e.g. a two-phase drive CCD, the signal charges are successively transferred at two-phase clocks of 40 MHz, which is twice as high as in the color mode, as indicated by φ1 and φ2 in the timing chart of FIG. 4.

In the monochromatic mode, only the signal charges corresponding to the Green light photo-electric converted by the center light receiving pixel line is required whereas the signal charges to be transferred by the signal charge transfer sections 31, 32, 35 and 36 are not necessary. Therefore, although the signal charges transferred by the signal charge transfer sections 31 and 36, as they are, are sent to the output circuits 51 and 56 through the final stage electrodes 41 and 46, respectively, they will not be subjected to the subsequent signal processing.

Figure 5:
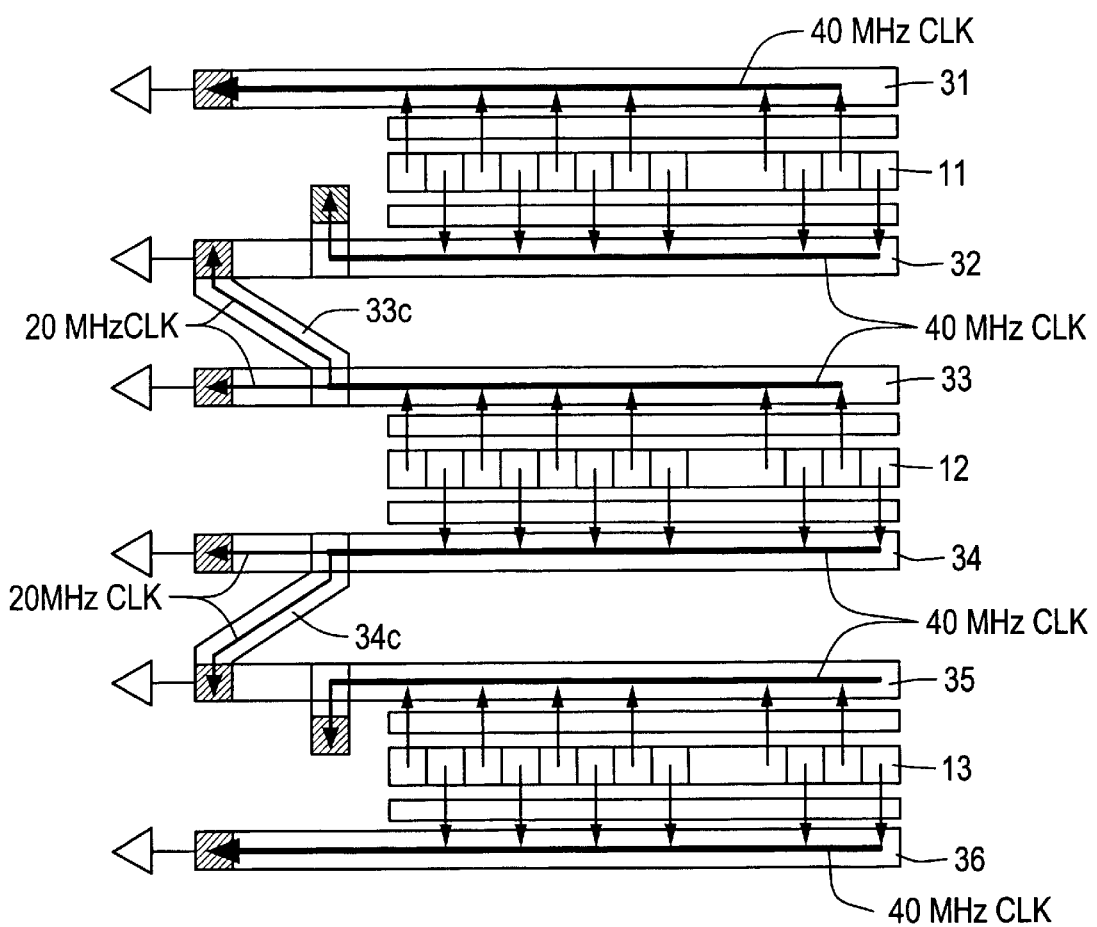
FIG. 5 is a view illustrating transfer directions of signal charges in a monochromatic mode.

By continuously placing the gate electrodes 321 and 351 (FIG. 2) in a closed state and by continuously placing the gate electrode 322 and 352 (FIG. 2) in an open state in the branch electrodes 32a and 35a, as shown in FIG. 5, the signal charges transferred by the signal charge transfer sections 32 and 35 are transferred to the charge drains 62 an 65 and will be abandoned there.

On the other hand, the signal charges corresponding to the Green light transferred by the signal transfer sections 33 and 34 are successively transferred at two-phase clocks φ1, φ2 (FIG. 4) of 40 MHz to reach the branch electrodes 33a and 34a successively.

Now, the gates 331 and 341 (FIG. 2) are controlled using a pulse of φ5 shown in FIG. 4, and the gates 332 and 342 (FIG. 2) are controlled using a pulse of φ6. Thus, the signal charges successively transferred to the branch electrodes 33a and 34a can be transferred in a manner alternately allotted to the charge transfer section 33b and branch transfer section 33c and to the charge transfer section 34b and branch transfer section 34c, respectively.

The signal charges transferred successively and alternately to the charge transfer section 33b and branch transfer section 33c, and the charge transfer section 34b and branch transfer section 34c are transferred at two-phase clocks of 20 MHz indicated by φ3, φ4 in FIG. 4, and sent to the output circuits 52, 53, 54 and 55 through the final stage electrodes 42, 43, 44 and 45.

In short, for the purpose of transferring the signal charges, four charge transfer lines can be used for a single light receiving pixel line 12 so that the signal charges can be externally produced at the frequency of 20 MHz for each charge transfer line and hence the data rate of a total of 80 MHz.

Such a signal transfer method provides flows of charges as shown in FIG. 5. Namely, all the signal charges corresponding to the Red light and Blue light are abandoned, and the signal charges corresponding to the Green light are transferred at 40 MHz to the branching point and after the branching, further transferred at 20 MHz so as to correspond to the output circuit.

In the monochromatic mode described above, the charges branched at the branch transfer sections 33c and 34c can be sent using the signal charge transfer sections 32 and 35 located on the adjacent light receiving pixel lines, respectively. For this reason, the same configuration as in the three-color image sensor can be adopted for the signal transfer section and output circuit, thereby realizing the high-speed charge transfer in the monochromatic mode without increasing the width of a sensor chip.

Figure 6:
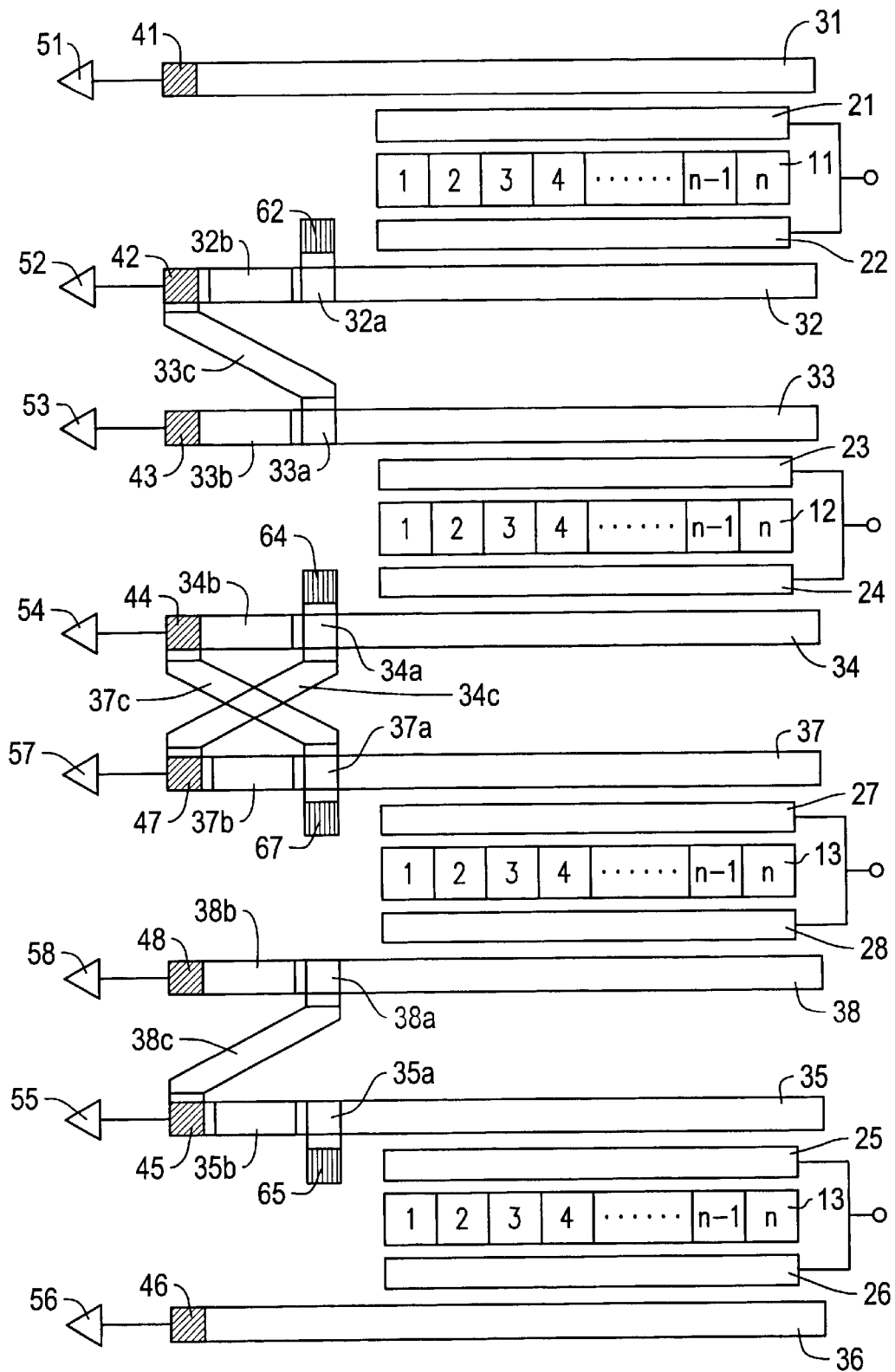
FIG. 6 is a schematic plan view illustrating an example of a four-line color image sensor.

In the embodiment described above, an explanation was given of an example of the three-line color image sensor. However, the present invention should not be limited to the case of three lines. FIG. 6 is a schematic plan view illustrating an example of a four-line color image sensor.

The four line color image sensor is provided with a light receiving pixel line 14 corresponding to near-infrared light in addition to the light receiving pixel lines 11, 12 and 13 corresponding to the Red light, Green light and Blue light in the three-line color image sensor as described above.

These light receiving pixel lines 11, 12, 13 and 14 are arranged in the order of the light receiving pixel line 11 corresponding to the Red light, light receiving pixel line 12 corresponding to the Green light, light receiving pixel line 14 corresponding to the near-infrared light and light receiving pixel line 13 corresponding to the Blue light.

On both sides of each of the light receiving pixel lines 11, 12, 13 and 14, signal shift gates 21, 22; 23, 24, 25, 26; and 27, 28 are arranged for transferring the charges captured by the corresponding light receiving pixel lines in a vertical direction on the drawing.

Further, on both sides of each of the light receiving pixel lines 11, 12, 13 and 14 between which the signal charge shift gates 21, 22; 23, 24; 25, 26; 27, 28 intervene, respectively, signal charge transfer sections 31, 32; 33, 34; 35, 36; and 37, 38 are arranged for transferring the transferred charges in a horizontal direction on the drawing.

To the final stages in the charge transfer directions of the respective signal charge transfer sections 31, 32, 33, 34, 35, 36, 37 and 38 final stage electrodes 41, 42, 43, 44, 45, 46, 47 and 48 are connected. To these electrodes, output circuits 51, 52, 53, 54, 55, 56, 57 and 58 are connected each of which consists of a signal charge detection section and an analog circuit such as a source follower, inverter, etc.

The feature of this embodiment resides in that the signal charge transfer sections 32, 33, 35 and 38 include branch electrodes 32a, 33a, 35a and 38a, respectively, each of which serves to branch the charge transfer direction into two directions of charge transfer section 32b and charge drain 62, charge transfer section 33b and branch transfer section 33c, charge transfer section 35b and charge drain 65, and charge transfer section 38b and charge transfer section 38c.

The signal charge transfer sections 34 and 37 include branch electrodes 34a and 37a, respectively, each of which serves to branch the charge transfer direction into three directions of charge transfer section 34b, branch transfer section 34c and charge drain 64, and three directions of charge transfer section 37b, branch transfer section 37c and charge drain 67.

The charge drains 62, 64, 65 and 67 serve to exhaust unnecessary charges (unnecessary charges according to a read mode) transferred by the signal charge transfer sections 32, 34, 35 and 37, respectively.

Using the color image sensor described above, the color image can be read (color mode) in the same manner as in the three-line color image sensor previously described. Specifically, the signal charges generated and stored in the light receiving pixel lines 11, 12, 13 and 14 are distributed into odd-number-pixel charges and even-number-pixel charges which are in turn transferred to the signal charge transfer sections 31, 32; 33, 34; 35, 36; and 37, 38 through the signal charge shift gates 21, 22; 23, 24; 25, 26; and 27, 28 respectively. In this case, the signal charges are successively transferred at two-phase clocks (e.g. 20 MHz).

It should be noted that the charges transferred by the signal charge transfer sections 31 and 36, as they are, are sent to the output circuits 51 and 56 through the final stage electrodes 41 and 46, respectively.

The charges transferred by the signal charge transfer sections 32, 33, 34, 35, 37 and 38 are transferred through the branch electrodes 32a, 33a, 34a, 35a, 37a, and 38a, respectively, and further supplied to the output circuits 52, 53, 54, 55, 57 and 58 from which these charges are externally outputted.

Of the signals thus outputted, the signals corresponding to the Red, Green and Blue outputted from the output circuits 51, 52, 53, 54, 55 and 56 are dealt with as normal color signals, whereas the signals corresponding to the near-infrared light outputted from the output circuits 57 and 58 are used to detect the near-infrared absorbing ink for-preventing a bill or bond from being forged.

Now, an explanation will be given of the charge transfer method for performing the high speed monochromatic image reading (monochromatic mode) using the color linear sensor according to this embodiment.

The signal charges generated and stored in the light receiving pixel lines 11, 12, 13 and 14 are distributed into odd-number-pixel charges and even-number-pixel charges which are in turn transferred to the signal charge transfer sections 31, 32; 33, 34; 35, 36; and 37, 38 through the signal charge shift gates 21, 22; 23, 24; 25, 26; and 27, 28, respectively. In this case, the signal charges are successively transferred at two-phase clocks (e.g. 40 MHz).

In the monochromatic mode, only the signal charges corresponding to the Green light photo-electric converted by the center light receiving pixel line is required whereas the signal charges to be transferred by the signal charge transfer sections 31, 32, 35, 36, 37, 38 are not necessary. Therefore, although the signal charges transferred by the signal charge transfer sections 31 and 36, as they are, are sent to the output circuits 51 and 56 through the final stage electrodes 41 and 46, respectively, they will not be subjected to the subsequent signal processing.

The signal charges transferred by the signal charge transfer sections 32 and 37 are transferred to the charge drains 62 and 67 through the branch electrodes 32a and 37a, respectively, and will be abandoned there.

The signal charges transferred by the signal charge transfer sections 35 and 38 are supplied to the output circuits 55 and 58 through the branch electrodes 35a and 38b via the final stage electrodes 45 and 48, but will not be subjected to the subsequent signal processing.

On the other hand, the signal charges corresponding to the Green light transferred by the signal transfer sections 33 and 34 are successively transferred at two-phase clocks φ1, φ2 (FIG. 4) of the frequency of 40 MHz to reach the branch electrodes 33a and 34a successively.

Thus, the signal charges successively transferred through the branch electrodes 33a and 34a can be transferred in a manner alternately distributed to the charge transfer section 33b and branch transfer section 33c and to the charge transfer section 34b and branch transfer section 34c, respectively.

The signal charges transferred successively and alternately to the charge transfer section 33b and branch transfer section 33c, and the charge transfer section 34b and branch transfer section 34c are transferred at two-phase clocks of 20 MHz and sent to the output circuits 52, 53, 54 and 55 through the final stage electrodes 42, 43, 44 and 45.

In short, for the purpose of transferring the signal charges, four charge transfer lines can be used for a single light receiving pixel line 12 so that the signal charges can be externally produced at the frequency of 20 MHz for each charge transfer line and hence the data rate of a total of 80 MHz.

Now, an explanation will be given of the charge transfer method for performing recognition read (recognition mode) using the color linear sensor according to this embodiment. This mode intends to detect the infrared absorption ink used for preventing the bill or bond from being forged.

Such recognition or detection, which is performed, in most cases, in a manner of pre-scanning before color copying or the like is performed, is desired to be performed at a high speed. Further, inmost cases, it is also performed in a manner of adding the near-infrared information to the Red, Green, Blue information. However, now, an explanation will be given of the case of performing the recognition at a high speed using only the near-infrared information.

The signal charges generated and stored in the light receiving pixel lines 11, 12 and 13 are distributed into odd-number-pixel charges and even-number-pixel charges which are in turn transferred to the signal charge transfer sections 31, 32; 33, 34; and 35, 36 through the signal charge shift gates 21, 22; 23, 24; and 25, 26, respectively. In this case, the signal charges are successively transferred at two-phase clocks (e.g. 40 MHz).

The signal charges generated and stored in the light receiving pixel line 14 are distributed into odd-number-pixel charges and even-number-pixel charges which are in turn transferred to the signal charge transfer sections 37 and 38 through the signal charge shift gates 27 and 28, respectively. In this case, the signal charges are successively transferred at two-phase clocks (e.g. 40 MHz).

In the high speed recognition mode, only the signal charges corresponding to the near-infrared light photoelectric converted by the light receiving pixel line 14 is required whereas the signal charges to be transferred by the signal charge transfer sections 31, 32, 33, 34, 35 and 36 are not necessary. Therefore, although the signal charges transferred by the signal charge transfer sections 31 and 36, as they are, are sent to the output circuits 51 and 56 through the final stage electrodes 41 and 46, respectively, they will not be subjected to the subsequent signal processing.

The signal charges transferred by the signal charge transfer sections 32 and 33 are supplied to the output circuits 52 and 53 through the branch electrodes 32a and 33a via the final stage electrodes 42 and 43, but will not be subjected to the subsequent signal processing.

The signal charges transferred by the signal charge transfer sections 34 and 35 are transferred to the charge drains 64 and 65 through the branch electrodes 34a and 35a, respectively, and will be abandoned there.

On the other hand, the signal charges corresponding to the near-infrared light transferred by the signal transfer sections 37 and 38 are successively transferred at two-phase clocks of 40 MHz to reach the branch electrodes 37a and 38a successively.

Thereafter, the signal charges successively transferred through the branch electrodes 37a and 38a are transferred in a manner alternately distributed to the charge transfer section 37b and branch transfer section 37c and to the charge transfer section 38b and branch transfer section 38c, respectively.

The signal charges transferred successively and alternately to the charge transfer section 37b and branch transfer section 37c, and the charge transfer section 38b and branch transfer section 38c are transferred at two-phase clocks of 20 MHz and sent to the output circuits 54, 55, 57 and 58 through the final stage electrodes 44, 45, 47 and 48.

In short, for the purpose of transferring the signal charges, four charge transfer lines can be used for a single light receiving pixel line 14 so that the data for recognition can be externally produced at the frequency of 20 MHz for each charge transfer line and hence the data rate of a total of 80 MHz.

In the above example, the color mode and recognition mode were performed separately. However, the read of the color image and recognition for forging prevention may be effected simultaneously. In this case, in order to use all the signal charges captured by the light receiving pixel lines 11, 12, 13 and 14, in the signal charge transfer sections 31 and 36, the signal charges, as they are, are transferred whereas in the signal charge transfer sections 32, 33, 34, 35, 37 and 38, they are linearly transferred through the branch electrodes 32a, 33a, 34a, 35a, 37a and 38a. Thus, all the signal charges are externally outputted from the output circuits 51, 52, 53, 54, 55, 56, 57 and 58.

In this case, using the data outputted from the output circuits 51, 52, 53, 54, 55 and 56, the color image can be created, whereas using the data outputted from the outputted from the output circuits 51, 52, 53, 54, 55, 56, 57 and 58, the recognition can be effected.

In the high-speed monochromatic mode, in which the light receiving pixel line 12 corresponding to the Green light is used, the light receiving pixel line 12 corresponding to the Green light was arranged centrally. Where it is desired that only the signal charges corresponding to the other color are extracted, the light receiving pixel line corresponding to this color may be arranged.

For example, information (inclusive of code information) for discriminating a copying machine which has effected color copying is generally printed in minute yellow dots each having an invisible size. By using the light receiving pixel line 13 corresponding to the Blue light which is a complementary color of yellow in order to recognize this printing, the yellow minute dots can be detected as black.

In the color image sensor adapted to such a use, with the light receiving pixel line 13 corresponding to the Blue light being centrally arranged, the same transfer of the signal charges as in the monochromatic mode is carried out. Specifically, before branching, the signal charges are transferred at two-phase clocks of 40 MHz, and after branching, they are transferred at two-phase clocks of 20 MHz and outputted in four channels using the signal charge transfer section and output circuit on the adjacent light receiving pixel line, thereby realizing the high speed detection.

Further, by constructing the image reading device using each of the color image sensors as described hitherto, the normal color image reading and high speed monochromatic image reading can be realized in a simple configuration.

Figure 7:
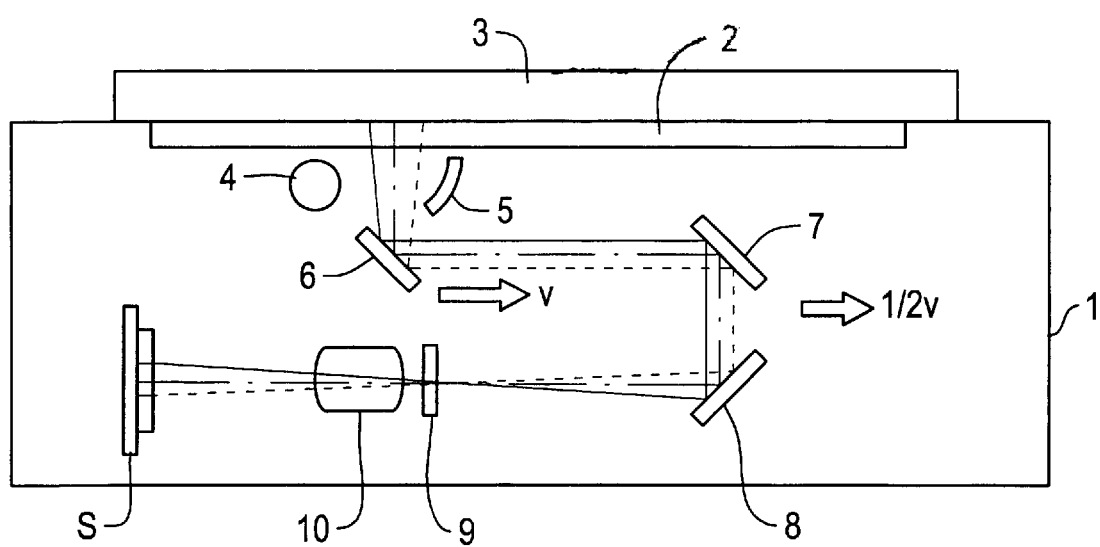
FIG. 7 is a schematic diagram showing the configuration of an image reading device.
Figure 8:
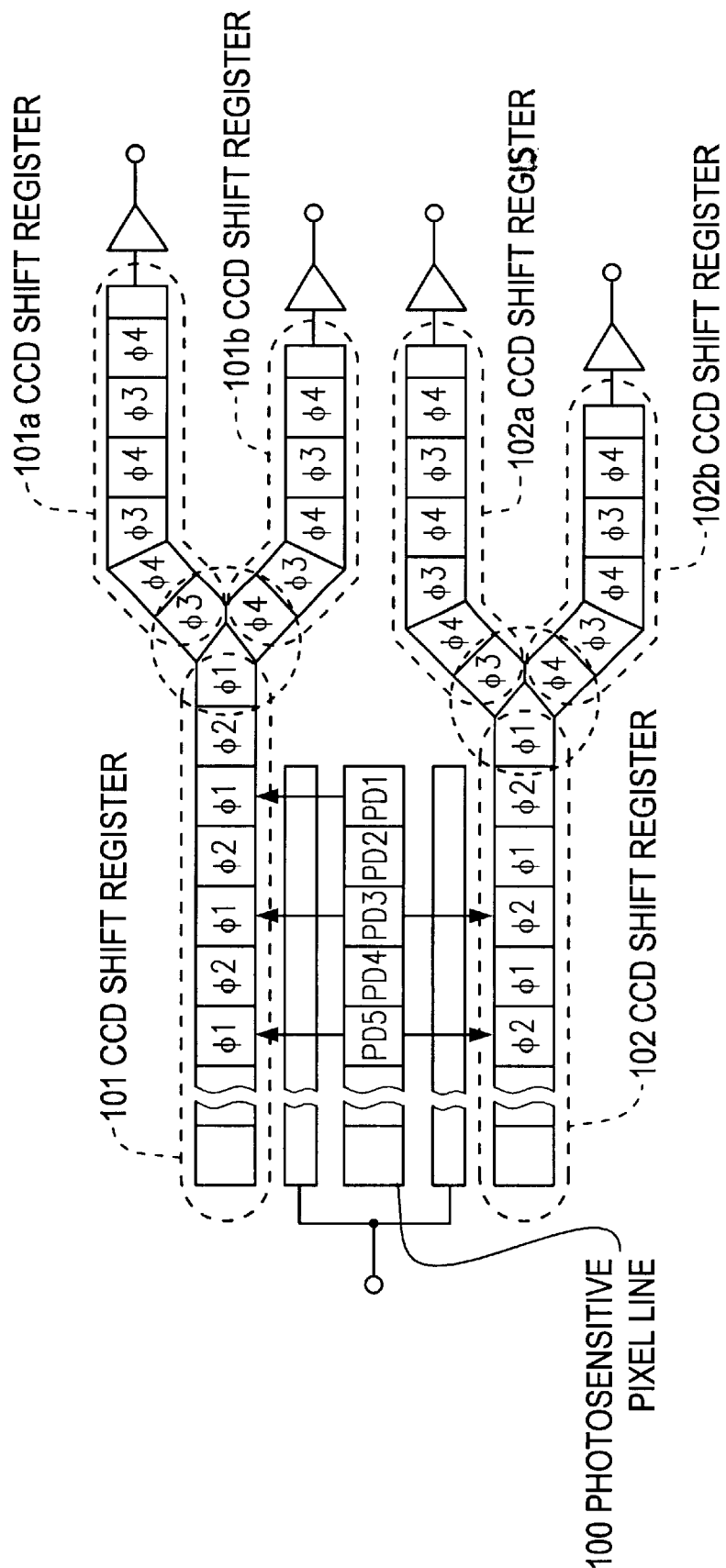
FIG. 8 is a schematic plan view illustrating an example of a conventional CCD linear image sensor.

FIG. 7 is a schematic diagram of the image reading device provided with the color image sensor according to the embodiments of the present invention. As seen from the figure, a platen glass 2 on which a document is placed is fit in an upper opening of a cabinet 1. A document (not shown) with an image to be read, which is oriented downward, is set on the platen glass 2. A platen cover 3 is openably attached to the upper surface of the cabinet 1. When the image of the document is read, the platen cover 3 is covered on the platen glass 2 so that the document is brought into contact with the platen glass 2.

The cabinet 1 houses a lamp 4 for illuminating the document set on the platen glass 2, a reflector 5 for effectively gathering the light emitted from the lamp 4 to the document face, a first mirror 6 for sideward reflecting the light reflected from the document, a second mirror 7 for downward reflecting the light reflected from the first mirror 6, and a third mirror 8 for sideward reflecting the light reflected from the second mirror 7.

Of these components, the lamp 4, reflector 5 and first mirror 6 are loaded on a full-rate carriage (not shown) and adapted to be movable at a speed $\underline{v}$ in a direction of an arrow indicated in FIG. 7. The second mirror 7 and the third mirror 8 are loaded on a half-rate carriage (not shown) and adapted to be movable at a speed (½). $\underline{v}$ in a direction of an arrow indicated in FIG. 7.

The cabinet 1 further houses a sagittal stopper 9 serving as a light shading means, a lens 10 for imaging the light reflected from the document face, and a color image sensor S according to this embodiment for converting the image focused by the lens 10 into an electric signal.

In such a configuration, the image reading device, which can effect the high-speed monochromatic image reading and high speed forging detection as well as the normal color image reading, can be realized as a simple configuration.

As understood from the description hitherto made, the linear image sensor, image reading device and charge transfer method according to the present invention has the following effects. The normal full color image reading and high-speed monochromatic image reading can be realized using a single color linear image sensor. In addition, an individual charge transfer means for high-speed charge transfer and the attendant output circuit are not required. Therefore, without enlarging the circuit scale, the color image reading and high-speed monochromatic image reading can be made compatible.

What is claimed is:

1. A linear image sensor comprising:
   a first and a second light receiving pixel lines for making photo-electric conversion;
   a first charge transfer means for transferring charges acquired from said first light receiving pixel line through the photo-electric conversion;
   a second charge transfer means for transferring charges acquired from said second light receiving pixel line through the photo-electric conversion; and
   a first branch transfer means for branching the charges from said first charge transfer means and transferring thereof to said second charge transfer means.

2. The linear image sensor of claim 1, further comprising:
   a first charge exhausting means for exhausting the charges from said second charge transfer means at an upstream position in a charge transfer direction from a position at a position where said second charge transfer means and said first branch transfer means merge with each other.

3. The linear image sensor of claim 1, wherein
   said first charge transfer means is located on the side of said second light receiving pixel line of said first light receiving pixel line, and
   said second charge transfer means is located on the side of said first light receiving pixel line of said second light receiving pixel line.

4. The linear image sensor of claim 1, further comprising:
   a third light receiving pixel line for making the photo-electric conversion, which is located on the side opposite to said second light receiving pixel line with respect to said first light receiving pixel line;
   a third charge transfer means for transferring charges acquired from said third light receiving pixel line through the photo-electric conversion;
   a fourth charge transfer means for transferring charges acquired from said first light receiving pixel line through the photo-electric conversion, which is located on the side opposite to said first charge transfer means with respect to said first light receiving pixel line; and
   a second branch transfer means for branching the charges from said fourth charge transfer means and transferring thereof to said third charge transfer means.

5. The linear image sensor of claim 4, further comprising:
   a first charge exhausting means for exhausting the charges from said second charge transfer means at an upstream position in a charge transfer direction from a position at a position where said second charge transfer means and said first branch transfer means merge with each other; and
   a second charge exhausting means for exhausting the charges from said third charge transfer means at an upstream position in a charge transfer direction from a position at a position where said fourth charge transfer means and said second branch transfer means merge with each other.

6. The linear image sensor of claim 4, wherein
   said first light receiving pixel line photo-electrically converts light corresponding to a green area,
   said second light receiving pixel line photo-electrically converts light corresponding to a red area, and
   said third light receiving pixel line photo-electrically converts light corresponding to a blue area.

7. The linear image sensor of claim 4, further comprising:
   a fourth light receiving pixel line for making the photo-electric conversion, which is located on the side opposite to said first light receiving pixel line with respect to said third light receiving pixel line;
   a fifth charge transfer means for transferring charges acquired from said fourth light receiving pixel line through the photo-electric conversion;
   a sixth charge transfer means for transferring charges acquired from said third light receiving pixel line through the photo-electric conversion, which is located on the side opposite to said third charge transfer means with respect to said third light receiving pixel line;
   a third branch transfer means for branching the charges from said sixth charge transfer means and transferring thereof to said fifth charge transfer means; and
   a fourth branch transfer means for transferring the charges from said third charge transfer means and transferring thereof to said fourth charge transfer means.

8. The linear image sensor of claim 7, further comprising:
   a first charge exhausting means for exhausting the charges from said second charge transfer means at an upstream position in a charge transfer direction from a position at a position where said second charge transfer means and said first branch transfer means merge with each other;
   a second charge exhausting means for exhausting the charges from said third charge transfer means at an upstream position in a charge transfer direction from a position at a position where said fourth charge transfer means and said second branch transfer means merge with each other;
   a third charge exhausting means for exhausting the charges from said fifth charge transfer means at an upstream position in a charge transfer direction from a position at a position where said fifth charge transfer means and said third branch transfer means merge with each other; and
   a fourth charge exhausting means for exhausting the charges from said fourth charge transfer means at an upstream position in a charge transfer direction from a position at a position where said fourth charge transfer means and said fourth branch transfer means merge with each other.

9. The linear image sensor of claim 7, wherein
   said first light receiving pixel line photo-electrically converts light corresponding to a green area; and
   said fourth light receiving pixel line photo-electrically converts light corresponding to an invisible area.

10. A image reading device using a linear image sensor comprising:
    a first and a second light receiving pixel lines for making photo-electric conversion;
    a first charge transfer means for transferring charges acquired from said first light receiving pixel line through the photoelectric conversion;
    a second charge transfer means for transferring charges acquired from said second light receiving pixel line through the photo-electric conversion; and a first branch transfer means for branching the charges from said first charge transfer means and transferring thereof to said second charge transfer means.

11. The image reading device of claim 10, wherein a color image output is obtained in such a manner that the charges captured by said first and second light receiving pixel lines are transferred at a first speed by said corresponding signal transfer means, and a monochromatic image output is obtained in such a manner that the charges captured by said first receiving pixel line are transferred at a second speed higher than the first speed by said first charge transfer means until a branching position and thereafter are transferred at the first speed using said first branch transfer means.

12. A charge transfer method in a linear image sensor comprising a first and a second light receiving pixel lines for making photo-electric conversion comprising the steps of:

transferring charges acquired from said first light receiving pixel line through the photo-electric conversion by a first charge transfer means;

transferring charges acquired from said second light receiving pixel line through the photo-electric conversion by a second charge transfer means; and branching the charges from said first charge transfer means and transferring them to said second charge transfer means.

13. The charge transfer method of claim 12, wherein the charges are transferred at a high speed before branching, and are transferred at a low speed after the branching.

14. The charge transfer method of claim 12, comprising the steps of:

acquiring a color image output is obtained in such a manner that the charges captured by said first and second light receiving pixel lines are transferred at a first speed by said corresponding signal transfer means, and acquiring a monochromatic image output is obtained in such a manner that the charges captured by said first receiving pixel line are transferred at a second speed higher than the first speed by said first charge transfer means until a branching position and thereafter are transferred at the first speed using said first branch transfer means.

15. The charge transfer method of claim 12, comprising the step of:

exhausting the charges transferred by said second charge transfer means on the way of charge transfer.

* * * * *